(12) United States Patent
Takiguchi et al.

(10) Patent No.: US 12,113,080 B2
(45) Date of Patent: Oct. 8, 2024

(54) SOLID-STATE IMAGING DEVICE

(71) Applicant: HAMAMATSU PHOTONICS K.K., Hamamatsu (JP)

(72) Inventors: Ryo Takiguchi, Hamamatsu (JP); Makoto Kono, Hamamatsu (JP); Keiichi Ota, Hamamatsu (JP); Tetsuya Taka, Hamamatsu (JP)

(73) Assignee: HAMAMATSU PHOTONICS K.K., Hamamatsu (JP)

(*) Notice: Subject to any disclaimer, the term of this patent is extended or adjusted under 35 U.S.C. 154(b) by 581 days.

(21) Appl. No.: 17/285,201

(22) PCT Filed: Sep. 11, 2019

(86) PCT No.: PCT/JP2019/035770
§ 371 (c)(1),
(2) Date: Apr. 14, 2021

(87) PCT Pub. No.: WO2020/090244
PCT Pub. Date: May 7, 2020

(65) Prior Publication Data
US 2021/0327929 A1    Oct. 21, 2021

(30) Foreign Application Priority Data

Oct. 31, 2018 (JP) ................................. 2018-205738

(51) Int. Cl.
*H01L 27/146*    (2006.01)

(52) U.S. Cl.
CPC .... *H01L 27/1462* (2013.01); *H01L 27/14643* (2013.01)

(58) Field of Classification Search
CPC ....................... H01L 27/1462; H01L 27/14643
See application file for complete search history.

(56) References Cited

U.S. PATENT DOCUMENTS

2012/0292727 A1    11/2012  Huang
2018/0108625 A1*    4/2018  Hosokawa ............ H01L 23/532

FOREIGN PATENT DOCUMENTS

| CN | 104508819 A | 4/2015 |
| CN | 105140315 A | 12/2015 |

(Continued)

OTHER PUBLICATIONS

International Preliminary Report on Patentability mailed May 14, 2021 for PCT/JP2019/035770.

*Primary Examiner* — Kevin K Pyo
(74) *Attorney, Agent, or Firm* — Faegre Drinker Biddle & Reath LLP

(57) ABSTRACT

A solid-state imaging device according to the disclosure includes a semiconductor substrate which has a main surface having a plurality of photosensitive regions, and an insulating film which is provided on the main surface of the semiconductor substrate. When the main surface of the semiconductor substrate is taken as a reference surface, a thickness of the insulating film from the reference surface is 0.5 μm or more, a surface (a main surface) of the insulating film on the side opposite to the main surface is a surface having flatness, and a plurality of types of bottom surfaces of which depths from the reference surface are different from each other are provided on the main surface of the semiconductor substrate in the photosensitive regions.

17 Claims, 17 Drawing Sheets

(56) References Cited

FOREIGN PATENT DOCUMENTS

| | | | |
|---|---|---|---|
| CN | 105229790 | A | 1/2016 |
| JP | 2006-332250 | A | 12/2006 |
| JP | 2008-060572 | A | 3/2008 |
| JP | 2014-003140 | A | 1/2014 |
| JP | 2014-179413 | A | 9/2014 |
| TW | 201401496 | A | 1/2014 |
| WO | WO-2013/190864 | A1 | 12/2013 |
| WO | WO-2015/001987 | A1 | 1/2015 |
| WO | WO-2017/126329 | A1 | 7/2017 |
| WO | WO 2018/092632 | A1 | 5/2018 |

\* cited by examiner

Fig.5
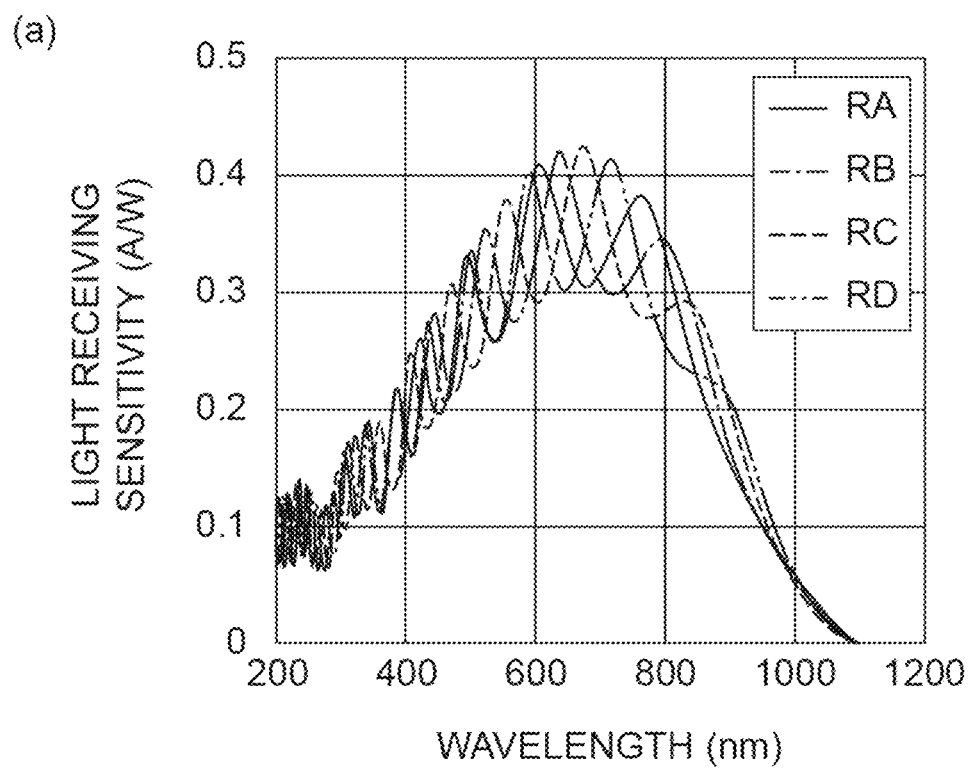
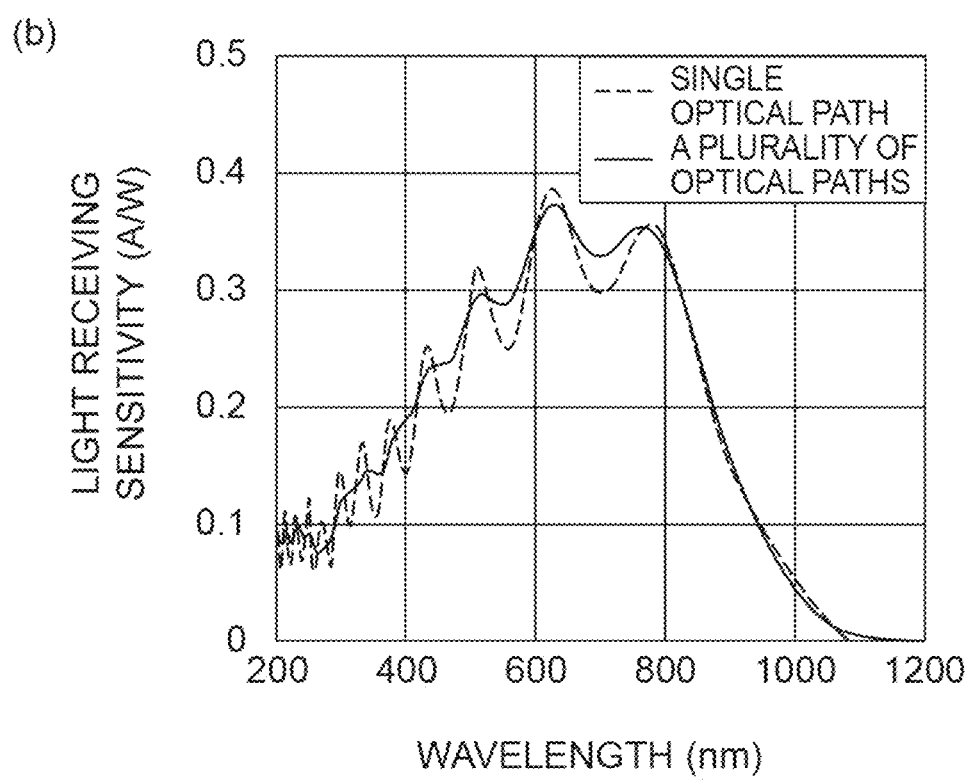

Fig.6
(a)
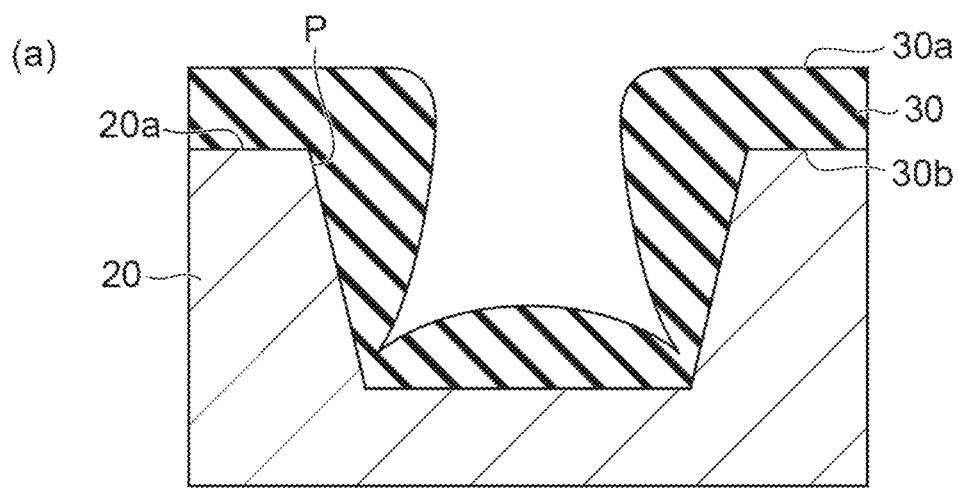
(b)
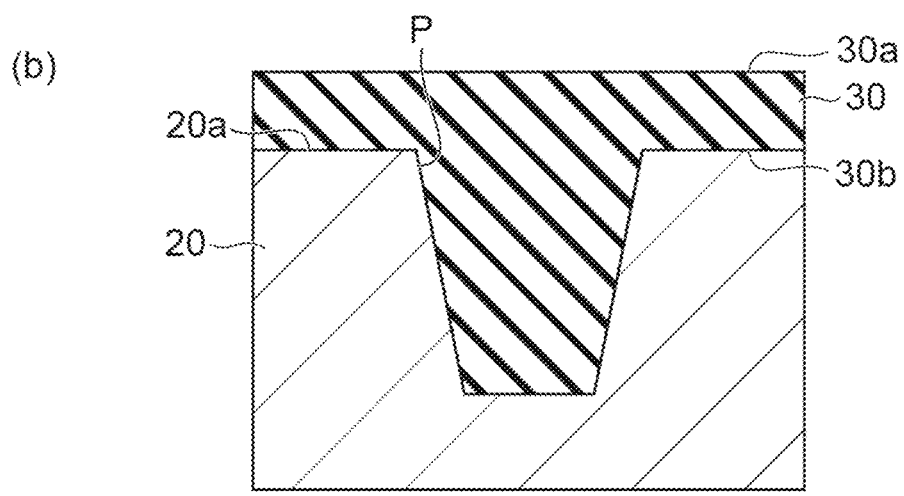

Fig.13
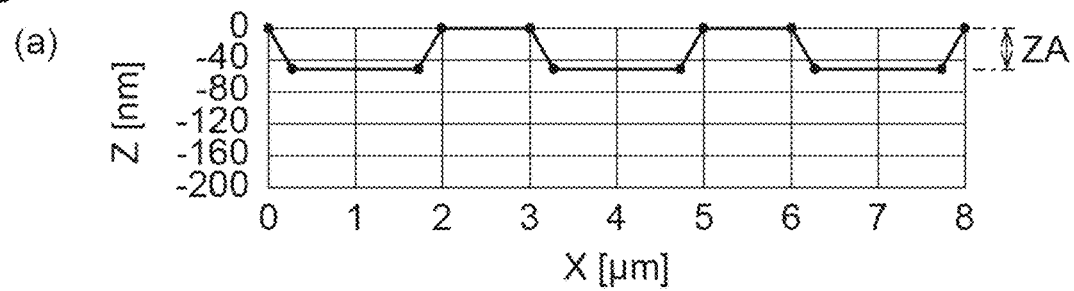
(a) (X1-X1)
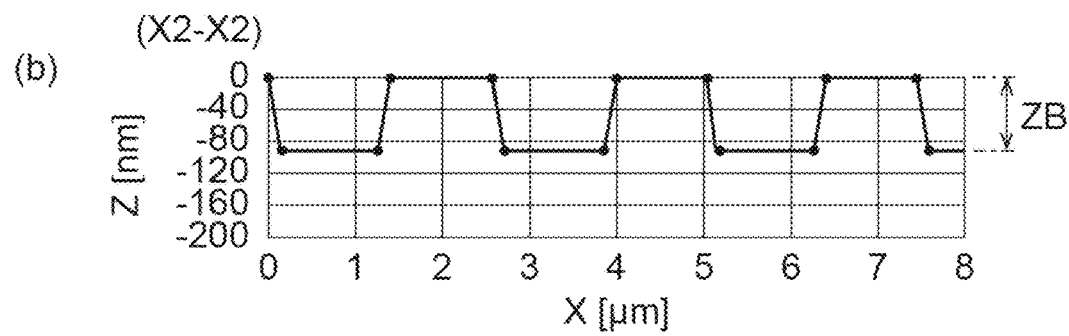
(b) (X2-X2)
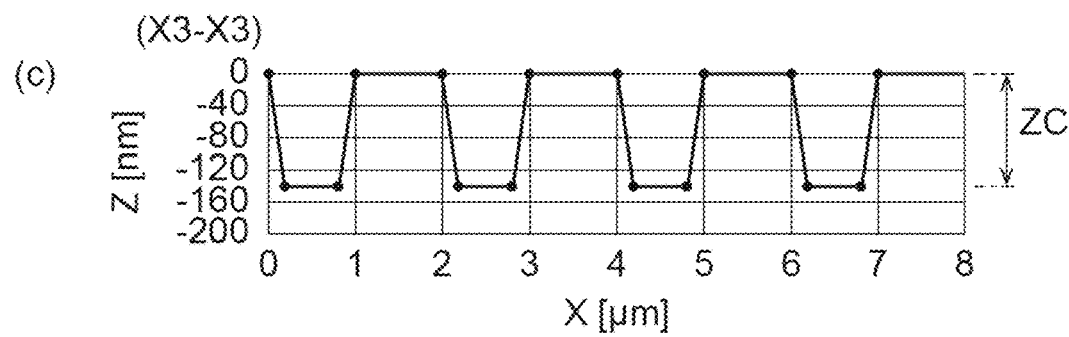
(c) (X3-X3)
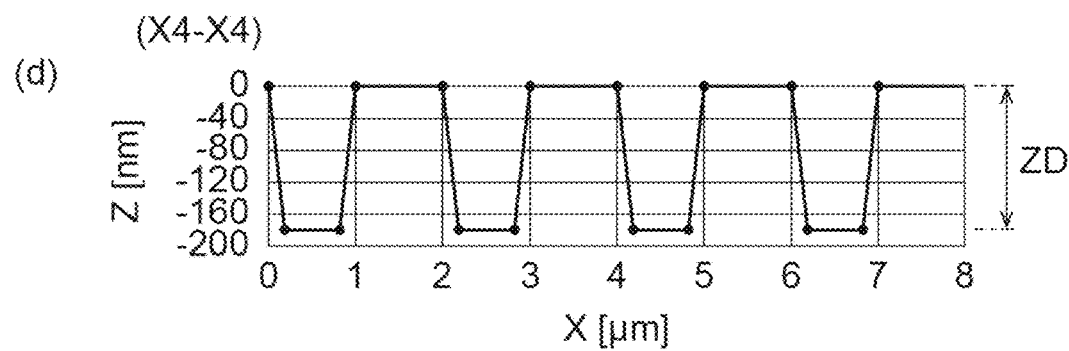
(d) (X4-X4)
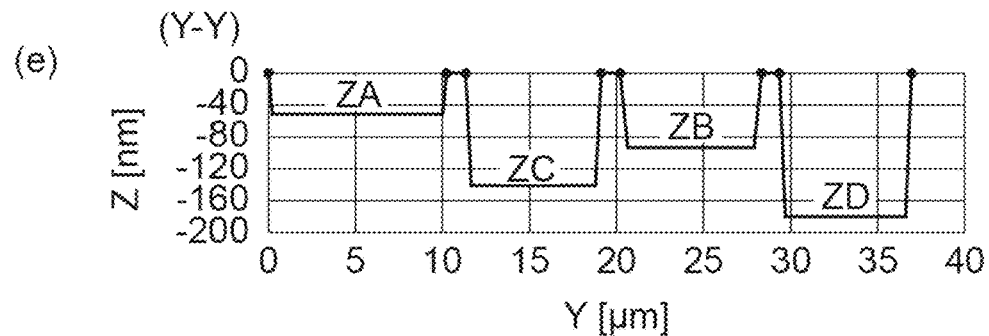
(e) (Y-Y)

SOLID-STATE IMAGING DEVICE

TECHNICAL FIELD

The disclosure relates to a solid-state imaging device.

BACKGROUND ART

Some solid-state imaging devices constituting an image sensor such as a CMOS have sensitivity in a wide wavelength region from an ultraviolet region to a near infrared region. In a solid-state imaging device which has sensitivity in the ultraviolet region, an insulating film such as a borophospho silicate glass (BPSG) film is formed as a protective film in a photosensitive region to curb deterioration of an element due to ultraviolet light. In order for the insulating film to fully exhibit a function as a protective film, a thickness of, for example, about 1 μm is required. In this case, it is conceivable that interference of incident light will occur between an upper surface of the insulating film and a main surface of a semiconductor substrate, and spectral sensitivity will vary periodically with respect to a wavelength of the incident light. For example, in a solid-state imaging device described in Patent Literature 1, in order to curb such a variation in the spectral sensitivity, the main surface is formed in a corrugated shape in which recessed and projection shapes are continuous, and the upper surface of the insulating film is made flat in the photosensitive region provided on the main surface of the semiconductor substrate.

CITATION LIST

Patent Literature

[Patent Literature 1] Japanese Unexamined Patent Publication No. 2014-3140

SUMMARY OF INVENTION

Technical Problem

In the above-described conventional solid-state imaging device, the film thickness of the insulating film changes according to the uneven shape of the main surface of the semiconductor substrate. Thus, an influence of the change in the film thickness in the entire insulating film is curbed, the variation in sensitivity is reduced, and the sensitivity is stabilized particularly in the ultraviolet region. However, in a solid-state imaging device in which the insulating film is formed to be relatively thick as a protective film, additional measures are required to reduce the variation in sensitivity in the wide wavelength region from the ultraviolet region to the near infrared region.

The disclosure has been made to solve the above problems, and an object thereof is to provide a solid-state imaging device capable of reducing variation in sensitivity in a wide wavelength region from an ultraviolet region to a near infrared region.

Solution to Problem

A solid-state imaging device according to an aspect of the disclosure includes a semiconductor substrate having a main surface having a plurality of photosensitive regions, and an insulating film provided on the main surface of the semiconductor substrate, wherein a thickness of the insulating film from a reference surface is 0.5 μm or more, when the main surface of the semiconductor substrate is taken as the reference surface, a surface of the insulating film on a side opposite to the main surface is a surface having flatness, and a plurality of types of bottom surfaces of which depths from the reference surface are different from each other are provided on the main surface of the semiconductor substrate in the photosensitive regions.

In the solid-state imaging device, the thickness of the insulating film from the reference surface is 0.5 μm or more. The insulating film can sufficiently serve as a protective film against ultraviolet light by providing an insulating film having a sufficient thickness. Further, in the solid-state imaging device, a surface of the insulating film on the side opposite to the main surface is a surface having flatness, and a plurality of types of bottom surfaces having different depths from the reference surface are provided on the main surface of the semiconductor substrate. Thus, when incident light is incident on the photosensitive regions, a plurality of interferences having different optical path lengths occur between the surface of the insulating film on the side opposite to the main surface and each of the bottom surfaces on the main surface of the semiconductor substrate. Accordingly, periods of variation in spectral sensitivity with respect to a wavelength of the incident light cancel each other out, and it is possible to reduce the variation in sensitivity in a wide wavelength region from an ultraviolet region to a near infrared region.

Also, a bottom surface having a relatively shallow depth from the reference surface and a bottom surface having a relatively deep depth from the reference surface may be alternately adjacent to each other in the plurality of types of bottom surfaces. In this case, when compared with a case in which the depths of the bottom surfaces change in a step-like manner, conformability of a shape of the insulating film with respect to the main surface of the semiconductor substrate can be reduced. Accordingly, the flatness for the surface of the insulating film on the side opposite to the main surface can be sufficiently improved.

Also, the solid-state imaging device may include a plurality of types of recesses which define each of the plurality of types of bottom surfaces, and the recesses having different depths may be continuous in a first direction, and the recesses having the same depth may be arranged to be spaced apart from each other in a second direction orthogonal to the first direction, in a plan view of the main surface. In this case, the periods of variation in the spectral sensitivity with respect to the wavelength of the incident light can cancel out due to each of the recesses which are continuous in the first direction. Further, since the reference surface is located between the recesses arranged in the second direction, sufficient flatness for the surface of the insulating film on the side opposite to the main surface is secured.

Also, a single recess which defines each of the plurality of types of bottom surfaces may be provided, and the bottom surfaces having different depths may be continuous in a first direction, and the bottom surfaces having the same depth may be continuous in a second direction orthogonal to the first direction, in a plan view of the main surface. In this case, since each of the bottom surfaces constituting a single recess can be formed with a sufficient area, it is possible to reduce the conformability of the shape of the insulating film with respect to the main surface of the semiconductor substrate due to the bottom surfaces. Therefore, flatness for the surface of the insulating film on the side opposite to the main surface can be sufficiently improved.

Also, a plurality of types of recesses which define each of the plurality of types of bottom surfaces may be provided, and the recesses having different depths may be arranged to be spaced apart from each other in a first direction, and the recesses having the same depth may be arranged to be spaced apart from each other in a second direction orthogonal to the first direction, in a plan view of the main surface. In this case, since the reference surface is located around each of the recesses, the sufficient flatness for the surface of the insulating film on the side opposite to the main surface is ensured.

Also, a plurality of types of recesses which define each of the plurality of types of bottom surfaces may be provided, and each of the recesses may extend in a first direction, and the recesses having different depths may be arranged to be spaced apart from each other in a second direction orthogonal to the first direction, in a plan view of the main surface. Also, in such a configuration, the periods of variation in the spectral sensitivity with respect to the wavelength of the incident light cancel each other out, and the variation in sensitivity in a wide wavelength region from the ultraviolet region to the near infrared region can be sufficiently reduced. In addition, the shape of each of the recesses can be simplified.

Also, at least one of the recesses has a single recess which defines two or more of the plurality of types of bottom surfaces. In this case, the periods of variation in the spectral sensitivity with respect to the wavelength of the incident light can cancel out more effectively.

Also, an opening width of the recess may be twice or less the thickness of the insulating film. When the insulating film is formed in the recess, a film forming rate on a side surface of the recess tends to be slower than a film forming rate on the bottom surface of the recess. Therefore, the inside of the recess can be sufficiently filled with the insulating film which grows on the side surface of the recess and the insulating film which grows on the bottom surface of the recess by defining the opening width of the recess as described above. Thus, the flatness for the surface of the insulating film on the side opposite to the main surface can be sufficiently improved.

Also, an opening width of at least one of the recesses may be equal to or less than the thickness of the insulating film. In this case, the inside of the recess can be sufficiently filled with the insulating film which grows on the side surface of the recess and the insulating film which grows on the bottom surface of the recess. Thus, the flatness for the surface of the insulating film on the side opposite to the main surface can be sufficiently improved.

Also, the plurality of types of the bottom surfaces may be 5 types or less. When the number of types of bottom surfaces having different depth positions are excessive, it is difficult to maintain the flatness for the bottom surfaces. The flatness for the bottom surfaces can be maintained by setting the number of the plurality of types of bottom surfaces to 5 or less.

Also, a height of unevenness of a surface of the insulating film on a side opposite to the main surface may be smaller than a maximum depth of the plurality of types of bottom surfaces. It is possible to sufficiently generate the effect of canceling out the periods of variation in the spectral sensitivity due to the plurality of interferences by sufficiently ensuring the flatness for the surface of the insulating film on the side opposite to the main surface.

Advantageous Effects of Invention

According to the disclosure, it is possible to reduce variation in sensitivity in a wide wavelength region from an ultraviolet region to a near infrared region.

BRIEF DESCRIPTION OF DRAWINGS

FIG. 5 is a view showing an effect of reducing variation in sensitivity.

FIG. 6 is a schematic view showing a relationship between a width of a recess and a film-forming state of an insulating film.

FIG. 13 is a cross-sectional view at a predetermined position in FIG. 12.

DESCRIPTION OF EMBODIMENTS

Hereinafter, preferred embodiments of a solid-state imaging device according to one aspect of the disclosure will be described in detail with reference to the drawings.

[Schematic Configuration of Solid-State Imaging Device]

Figure 1:
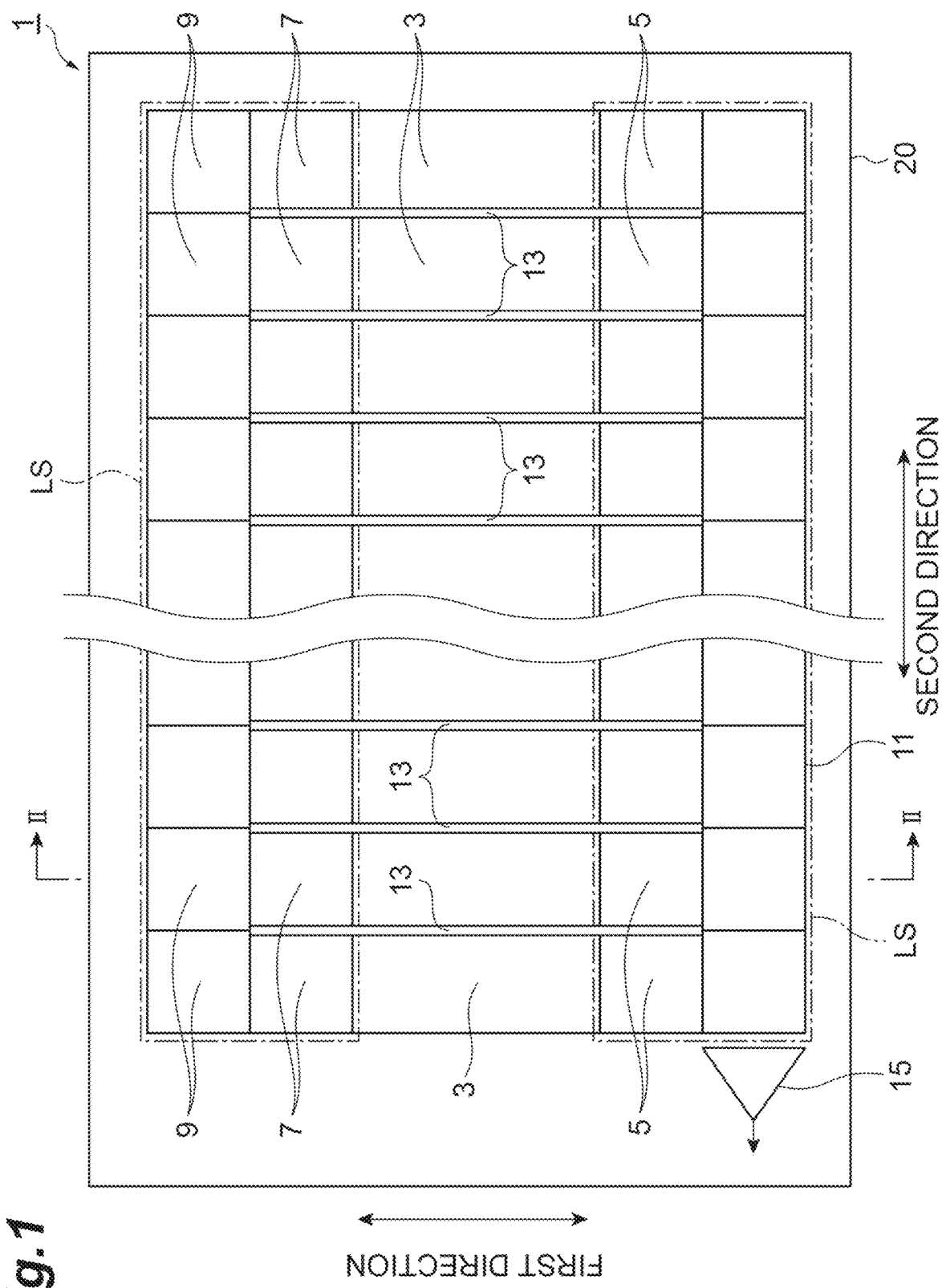
FIG. 1 a plan view showing a schematic configuration of a solid-state imaging device.
Figure 2:
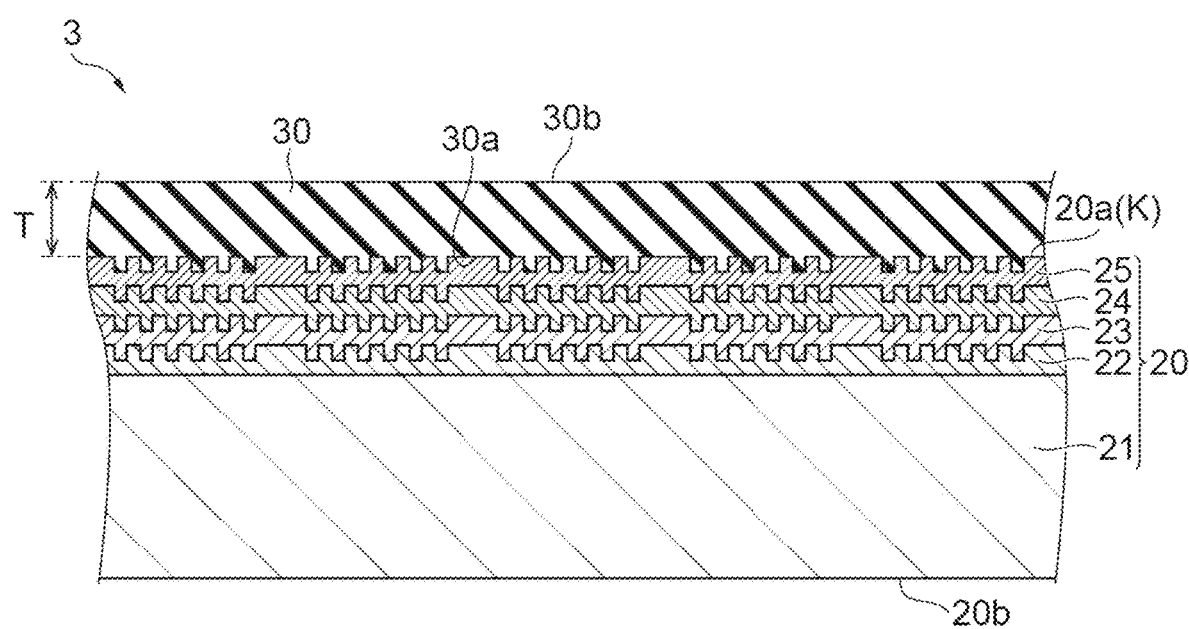
FIG. 2 is a cross-sectional view taken along line II-II in FIG. 1.

First, a schematic configuration of a solid-state imaging device which is common to each of embodiments will be described. FIG. 1 is a plan view showing a schematic configuration of a solid-state imaging device. Further, FIG. 2 is a cross-sectional view taken along line II-II in FIG. 1. As shown in FIG. 1, the solid-state imaging device 1 includes a plurality of photosensitive regions 3, a plurality of transfer gate units 5, a plurality of anti-blooming gate units 7, a plurality of anti-blooming drain units 9, and a shift register unit 11. These constituents are formed on a main surface 20a of a semiconductor substrate 20. The solid-state imaging device 1 of the embodiment is, for example, a surface-incident type image sensor, and one photosensitive region 3 constitutes one pixel.

Each of the photosensitive region 3 is sensitive to incident light and generates an electric charge according to an intensity of the incident light. That is, the photosensitive region 3 serves as a photoelectric conversion unit. In the embodiment, a planar shape of the photosensitive region 3 is a rectangle formed by two long sides and two short sides. The plurality of photosensitive regions 3 are arranged in a second direction (a direction following a short-side direction of the photosensitive region 3) orthogonal to a first direction following a long-side direction of the photosensitive region 3 and are disposed in an array shape in a one-dimensional direction. The shape of the photosensitive region 3 is not limited to a substantially rectangular shape described above, and various shapes can be adopted.

Each of the transfer gate units 5 corresponds to each of the photosensitive regions 3 and is disposed on one short-side side of the photosensitive region 3 which forms the planar shape. That is, the plurality of transfer gate units 5 are arranged in the second direction on one short-side side of the photosensitive region 3 which forms the planar shape. The transfer gate unit 5 acquires an electric charge generated in the photosensitive region 3 and transfers the acquired electric charge as a signal charge in the first direction. An isolation region 13 is disposed between the adjacent transfer gate units 5. The isolation region 13 realizes electrical separation between the transfer gate units 5.

The anti-blooming gate units 7 respectively correspond to the photosensitive regions 3 and are disposed on the other short-side side of the photosensitive region 3 which forms the planar shape. That is, the plurality of anti-blooming gate units 7 are arranged in the second direction on the other short-side side of the photosensitive region 3 which forms the planar shape. The anti-blooming gate unit 7 acquires an electric charge generated in the photosensitive region 3 and transfers the acquired electric charge as an unnecessary electric charge in the first direction. The isolation region 13 is disposed between the adjacent anti-blooming gate units 7. The isolation region 13 realizes electrical separation between the anti-blooming gate units 7.

The anti-blooming drain units 9 respectively correspond to a plurality of anti-blooming gate units 7 and are disposed adjacent to the anti-blooming gate units 7 in the first direction. That is, the plurality of anti-blooming drain units 9 are arranged in the second direction on the other short-side side of the photosensitive region 3 which forms the planar shape. The anti-blooming drain unit 9 is connected to a predetermined fixed potential and discharges an unnecessary charge transferred from the corresponding anti-blooming gate unit 7.

The shift register units 11 respectively correspond to the plurality of transfer gate units 5 and are disposed adjacent to the transfer gate unit 5 in the first direction. That is, the plurality of shift register units 11 are arranged in the second direction on the other short-side side of the photosensitive region 3 which forms the planar shape. The shift register unit 11 receives the signal charges transferred from the transfer gate unit 5, transfers the signal charges in the second direction, and sequentially outputs the signal charges to a read amplifier unit 15. The signal charge output from the shift register unit 11 is converted into a voltage by the read amplifier unit 15 and is output to the outside of the solid-state imaging device 1 as a voltage for each of the photosensitive regions 3 disposed in the second direction.

A light-shielding film LS is disposed in a region other than the plurality of photosensitive regions 3. In the embodiment, the light-shielding film LS is disposed to cover the transfer gate unit 5, the anti-blooming gate unit 7, the anti-blooming drain unit 9, and the shift register unit 11. The light-shielding film LS can prevent light from being incident on these regions and can prevent generation of unnecessary charge due to the light incident on these regions.

In the photosensitive region 3, as shown in FIG. 2, an uneven shape which will be described later is provided for each pixel on the main surface 20a of the semiconductor substrate 20. Further, an insulating film 30 is provided on the main surface 20a of the semiconductor substrate 20. The semiconductor substrate 20 has the main surface 20a and a main surface 20b facing each other. In the embodiment, the main surface 20a is a light incident surface on the semiconductor substrate 20. The semiconductor substrate 20 includes a p type semiconductor region 21, a p− type semiconductor region 22, an n+ type semiconductor region 23, a p+ type semiconductor region 24, and an oxide film 25 from the main surface 20b side. In the embodiment, the semiconductor substrate 20 is made of Si. When the semiconductor substrate 20 is made of Si, a Group 3 element such as B is used as the p type impurity, and a Group 5 element such as N, P, and As is used as the n-type impurity.

The oxide film 25 is, for example, a silicon oxide film. The oxide film 25 serves as a gate oxide film of a MOS transistor in the transfer gate unit 5. Further, the oxide film 25 has a role of preventing components from the insulating film 30 from intruding into the semiconductor substrate 20 in the photosensitive region 3. For example, when the insulating film 30 is a BPSG film as described later, the oxide film 25 prevents B (boron) and P (phosphorus) from the BPSG film from intruding into the semiconductor substrate 20. When the oxide film 25 is provided on the semiconductor substrate 20, a surface of the oxide film 25 can be regarded as the main surface 20a of the semiconductor substrate 20. When the oxide film 25 is not provided on the semiconductor substrate 20, a surface of the p+ type semiconductor region 24 becomes the main surface 20a of the semiconductor substrate 20. A semiconductor region constituting the semiconductor substrate 20 is not limited to the configuration shown in FIG. 2. For example, the p+ type semiconductor region 24 may not be provided, the n+ type semiconductor region 23 may be located on a p− type semiconductor region 22, and the oxide film 25 may be directly formed on the n+ type semiconductor region 23.

The insulating film 30 has a main surface 30a and a main surface 30b facing each other. The main surface 30a is a surface facing the main surface 20a side of the semiconductor substrate 20, and the main surface 30b is a surface facing the side opposite to the main surface 20a of the semiconductor substrate 20. The insulating film 30 may be formed by, for example, vapor deposition. The main surface 30a is a surface having a shape which follows the uneven shape provided on the main surface 20a of the semiconductor substrate 20. The main surface 30b is a surface having sufficient flatness with respect to the uneven shape due to reflow or chemical mechanical polishing (CMP) or the like. The insulating film 30 is, for example, a boro-phospho silicate glass (BPSG) film and also serves as an antireflection film (an AR film). Further, when the main surface 20a of the semiconductor substrate 20 is a reference surface K, a thickness T of the insulating film 30 from the reference surface K is 0.5 µm or more. Thus, the insulating film 30 also serves as a protective film for curbing deterioration of an element due to ultraviolet light.

The thickness T of the insulating film 30 is, for example, 0.5 µm to 3 µm, and preferably 0.6 µm to 1.5 µm. A lower limit value of the thickness T of the insulating film 30 is a value in consideration of a function as a protective film, that is, exhibiting sufficient ultraviolet light resistance. Further, an upper limit value of the thickness T of the insulating film 30 is a value in consideration of occurrence of variation in sensitivity in an infrared region and processing restrictions (for example, ease of forming a contact hole). In a range exceeding 1.0 µm, since an effect in which the ultraviolet light resistance is improved becomes small, the thickness T of the insulating film 30 is 1.0 µm in the embodiment.

First Embodiment

Figure 3:
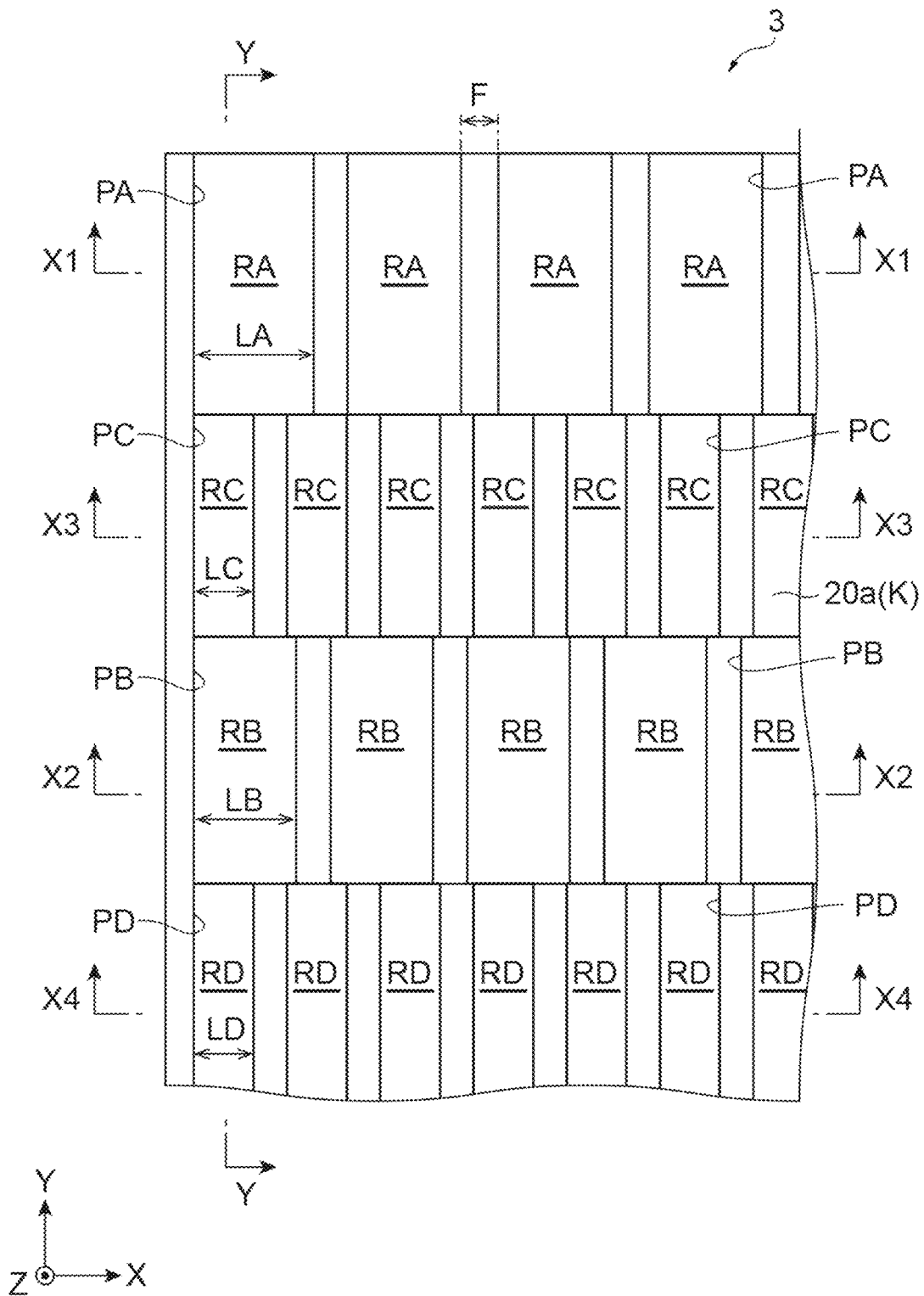
FIG. 3 is an enlarged plan view of a main part showing a part of a photosensitive region of the solid-state imaging device according to a first embodiment.
Figure 4:
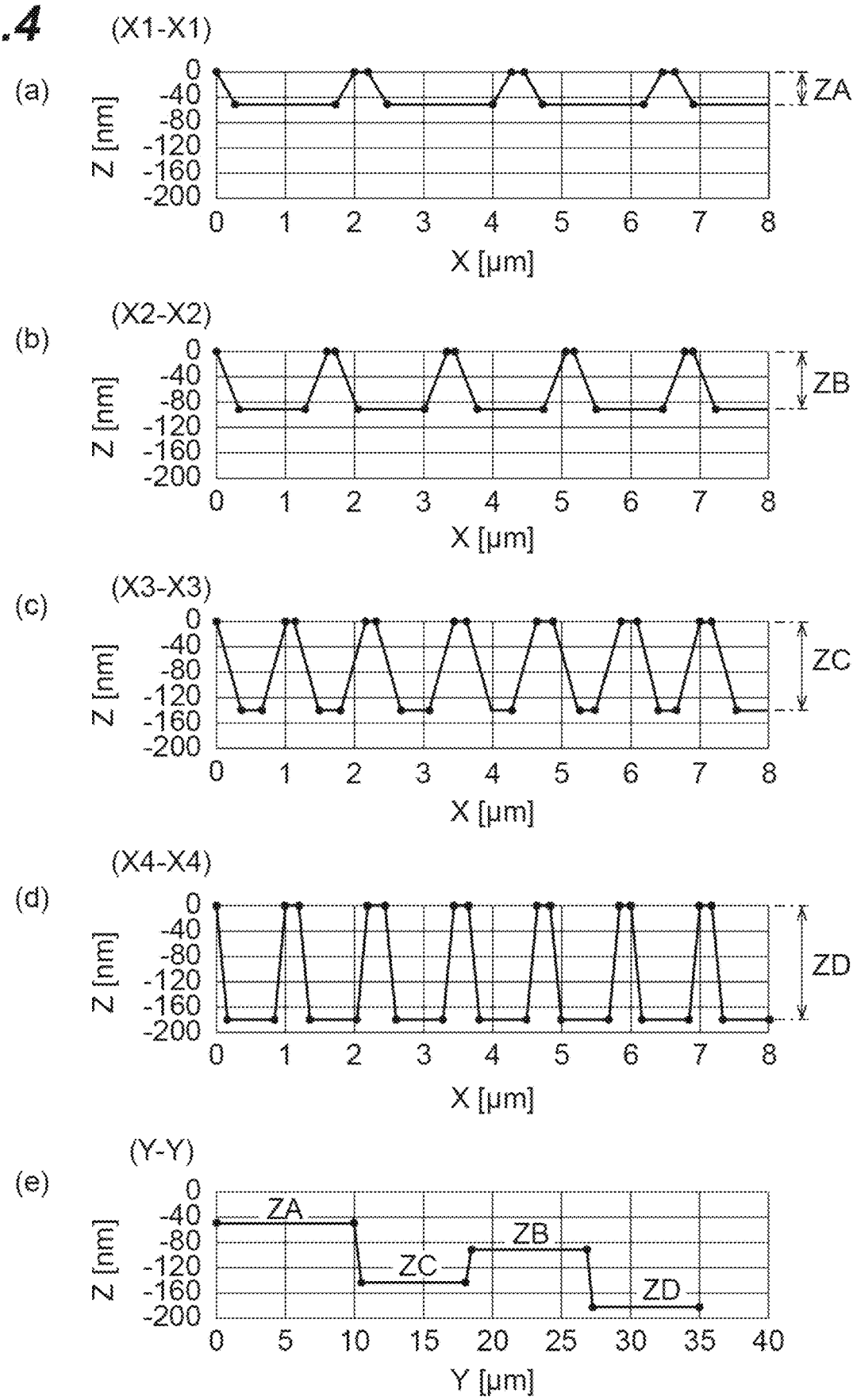
FIG. 4 is a cross-sectional view at a predetermined position in FIG. 3.

FIG. 3 is an enlarged plan view of a main part showing a part of the photosensitive region of the solid-state imaging device according to a first embodiment. In FIG. 3, for convenience of explanation, the insulating film 30 is omitted, while XYZ axes are shown. The X-axis is an axis corresponding to the second direction in FIG. 1, and the Y-axis is an axis corresponding to the first direction in FIG. 1. The Z-axis is an axis corresponding to a thickness direction of the semiconductor substrate 20. Further, FIG. 4 is a cross-sectional view taken at a predetermined position in FIG. 3. FIG. 3(a) is a cross-sectional view taken along line X1-X1, FIG. 3(b) is a cross-sectional view taken along line X2-X2, FIG. 3(c) is a cross-sectional view taken along line X3-X3, FIG. 3(d) is a cross-sectional view taken along line X4-X4, and FIG. 3(e) is a cross-sectional view taken along line Y-Y.

As shown in FIGS. 3 and 4, in the photosensitive region 3, a plurality of types of bottom surfaces R having different depths from the reference surface K are provided on the main surface 20a of the semiconductor substrate 20. In the embodiment, four types of bottom surfaces RA to RD having different depths are provided, and each of the bottom surfaces RA to RD selectively thermally oxidizes, for example, the main surface 20a of the semiconductor substrate 20 and is defined by four types of recesses PA to PD obtained by wet etching the thermally oxidized portion. Each of the recesses PA to PD and the bottom surfaces RA to RD has a rectangular shape having a long side in the first direction and a short side in the second direction in a plan view.

As shown in FIG. 4, inner wall surfaces of the recesses PA to PD are inclined to narrow from the opening surface side toward the bottom surface side. In the embodiment, a depth ZA of the bottom surface RA is 50 nm, a depth ZB of the bottom surface RB is 90 nm, a depth ZC of the bottom surface RC is 140 nm, and a depth ZD of the bottom surface RD is 180 nm. An opening width L of the recess P is twice or less the thickness T of the insulating film 30. Further, at least one opening width L of the recess P is equal to or less than the thickness T of the insulating film 30. Here, the recess P has a rectangular shape, and the opening width L is defined by a width of the opening surface of the recess P in a short side direction. In the embodiment, an opening width LA of the recess PA is 2.0 µm, an opening width LB of the recess PB is 1.5 µm, an opening width LC of the recess PC is 1.0 µm, and an opening width LD of the recess PD is 1.0 µm.

In the embodiment, as shown in FIGS. 3 and 4, in a plan view of the main surface 20a, the recesses P having different depths are continuous in the first direction. More specifically, one arrangement pattern is formed in the order of the recess PA, the recess PC, the recess PB, and the recess PD in the first direction, and the arrangement pattern is repeatedly arranged in the first direction. In the embodiment, when seen in the first direction, the bottom surface R having a relatively shallow depth from the reference surface K and the bottom surface R having a relatively deep depth from the reference surface K are adjacent to each other due to such an arrangement pattern (refer to FIG. 4(e)). That is, these bottom surfaces R do not define a shape which becomes deeper in a step-like manner or a shape which becomes shallower in a step-like manner in the first direction, and a mountain valley shape is formed between the adjacent bottom surfaces R.

Further, in the embodiment, as shown in FIGS. 3 and 4, in the plan view of the main surface 20a, the recesses P having the same depth are arranged to be spaced apart from each other in the second direction. In each of the recess PA to the recess PD, a spacing width F in the second direction is 0.2 µm. That is, the reference surface K is interposed between the recesses PA, between the recesses PB, between the recesses PC, and between the recesses PD with a width of 0.2 µm in the second direction (refer to FIGS. 4(a) to 4(d)).

As described above, in the solid-state imaging device 1, the thickness T of the insulating film 30 from the reference surface K is 0.5 µm or more. The insulating film 30 can sufficiently serve as a protective film against ultraviolet light by providing the insulating film 30 having a sufficient thickness T. Therefore, it is possible to curb deterioration of the solid-state imaging device 1 due to ultraviolet light, and it is possible to curb occurrence of a problems such as reduction of detection accuracy due to deterioration.

Further, in the solid-state imaging device 1, the main surface 30b of the insulating film 30 is a surface having flatness, and a plurality of types of bottom surfaces R having different depths from the reference surface K are provided on the main surface 20a of the semiconductor substrate 20. Thus, when the incident light is incident on the photosensitive region 3, a plurality of interferences having different optical path lengths between the main surface 30b of the insulating film 30 and the bottom surfaces RA to RD on the main surface 20a of the semiconductor substrate 20 occur. Therefore, as shown in FIG. 5(a), periods of variation in spectral sensitivity with respect to a wavelength of the incident light cancel each other out. Therefore, as shown in FIG. 5(b), when compared with a case in which interference having a single optical path length occurs between the main surface 20a of the semiconductor substrate 20 and the main surface 30b of the insulating film 30, it is possible to reduce the variation in sensitivity in a wide wavelength region from an ultraviolet region to a near infrared region.

Further, in the embodiment, in the plurality of types of bottom surfaces R, the bottom surface R having a relatively shallow depth from the reference surface K and the bottom surface R having a relatively deep depth from the reference surface K are alternately adjacent to each other. In this case, conformability of a shape of the insulating film 30 to the main surface 20a of the semiconductor substrate 20 can be reduced as compared with the case in which the depth of the bottom surface R changes in the step-like manner Therefore, the flatness for the main surface 30b of the insulating film 30 can be sufficiently improved. It is possible to achieve an effect in which the period of variation in the spectral sensitivity with respect to the wavelength of the incident light cancels out as intended by sufficiently increasing the flatness for the main surface 30b of the insulating film 30.

Further, in the embodiment, the plurality of types of bottom surfaces RA to RD are respectively defined by the plurality of types of recesses PA to PD. Additionally, in the plan view of the main surface 20a, the recesses P having different depths are continuous in the first direction, and the recesses having the same depth are arranged to be spaced apart from each other in the second direction. According to such a configuration, the period of variation in the spectral sensitivity with respect to the wavelength of the incident light can effectively cancel out due to each of the recesses P continuous in the first direction. Further, since the reference surface K is located between the recesses P arranged in the second direction, the sufficient flatness for the main surface 30b of the insulating film 30 is ensured.

In the embodiment, the reference surface K is interposed between the recesses P in the second direction, and one of the interferences having different optical path lengths may occur between the reference surface K and the main surface 30b of the insulating film 30. This also contributes to canceling out the periods of variation in the spectral sensitivity with respect to the wavelength of the incident light and acts to enhance an effect in which the variation in sensitivity in a wide wavelength region from the ultraviolet region to the near infrared region is reduced.

Further, in the embodiment, the opening width L of the recess P is twice or less the thickness T of the insulating film 30, and the opening width L of at least one recess P is equal to or less than the thickness T of the insulating film 30. When the insulating film 30 is formed in the recess P, a film forming rate on a side surface (an inner wall surface) of the recess P tends to be slower than a film forming rate on the bottom surface of the recess P. For example, since a film is formed on the bottom surface of the recess P in a vertical direction and a horizontal direction, whereas a film is mainly formed on the side surface of the recess only in the horizontal direction, the film forming rate on the side surface of the recess P is about half the film forming rate on the bottom surface of the recess P. Therefore, when the opening width L of the recess P exceeds twice the thickness T of the insulating film 30, as shown in FIG. 6(a), the insulating film 30 is not completely filled into the recess P, and thus unevenness on the main surface 30b of the insulating film 30 is caused. On the other hand, when the opening width L of the recess P is twice or less the thickness T of the insulating film 30, as shown in FIG. 6(b), the inside of the recess P can be sufficiently filled by the insulating film 30 which grows on the side surface of the recess P and the insulating film 30 which grows on the bottom surface of the recess P. Thus, the flatness for the main surface 30b of the insulating film 30 can be sufficiently improved.

Figure 7:
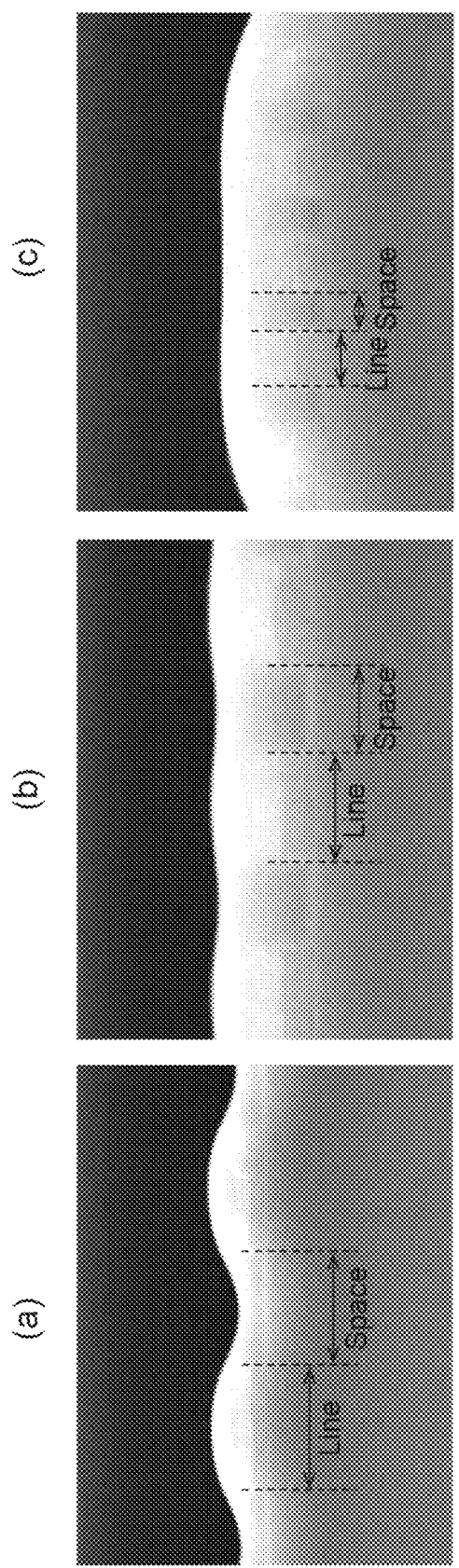
FIG. 7 is a photograph showing a verification result of a relationship between an opening width of the recess and flatness for an upper surface of the insulating film.

FIG. 7 is a photograph showing a verification result of a relationship between the opening width of the recess and the flatness for the upper surface of the insulating film. In all cases, the thickness of the insulating film (the BPSG film) from the reference surface is 0.6 µm. FIG. 7(a) shows a result when a line/space of the recess is 3.0 µm/3.0 µm, and FIG. 7(b) shows a result when the line/space of the recess is 1.2 µm/1.2 µm. Further, FIG. 7(c) is a result when the line/space of the recess is 0.6 µm/0.6 µm. In FIG. 7(a), the opening width of the recess is five times the thickness of the insulating film, and unevenness appears on the upper surface of the insulating film following the shape of the recess. On the other hand, in FIG. 7(b), the opening width of the recess is twice the thickness of the insulating film, and the flatness for the upper surface of the insulating film is improved.

Further, in FIG. 7(c), the opening width of the recess is the same as the thickness of the insulating film, and the flatness for the upper surface of the insulating film is further improved.

When the BPSG film is used as the insulating film 30, fluidity is generally low because the BPSG film is glass. Although the fluidity varies according to conditions such as a reflow time, a reflow temperature, and a concentration of B (boron) and P (phosphorus), as the process becomes finer, a reflow becomes more difficult at high temperature for a long time, and the flatness for the BPSG film due to the reflow is limited. On the other hand, the flatness for the main surface 30b of the insulating film 30 can be realized by defining the opening width L of the recess P on the basis of the thickness T of the insulating film 30 and making the local unevenness of the main surface 20a dense, regardless of reflow conditions.

Regarding the flatness for the main surface 30b of the insulating film 30, from the viewpoint of sufficiently canceling out the period of variation in the spectral sensitivity due to the plurality of interferences, a height of the unevenness (a difference in a height between the highest projection and the lowest recess on the main surface 30b) on the main surface 30b of the insulating film 30 is preferably smaller than the maximum depth of the plurality of types of bottom surfaces R. Further, the height of the unevenness on the main surface 30b of the insulating film 30 is more preferably 0.5 times or less, more preferably 0.1 times or less, the maximum depth of the plurality of types of bottom surfaces R. In the embodiment, the bottom surface RD has the maximum depth from the reference surface K, and a depth ZD of the bottom surface RD is 180 nm. Therefore, the height of the unevenness of the main surface 30b of the insulating film 30 is preferably smaller than 180 nm, more preferably 90 nm or less, and particularly preferably 18 nm or less.

Further, from the same viewpoint, the height of the unevenness on the main surface 30b of the insulating film 30 may be smaller than the difference between the maximum depth and the minimum depth of the plurality of types of bottom surfaces R. In this case, the height of the unevenness on the main surface 30b of the insulating film 30 is preferably 0.5 times or less the difference between the maximum depth and the minimum depth of the plurality of types of bottom surfaces R. In the embodiment, since the bottom surface RD has the maximum depth from the reference surface K (the depth ZD=180 nm), and the bottom surface RA has the minimum depth (the depth ZA=50 nm), a difference therebetween is 130 nm. Therefore, the height of the unevenness on the main surface 30b of the insulating film 30 may be smaller than 130 nm, and more preferably 65 nm or less.

Furthermore, from the same viewpoint, the height of the unevenness of the main surface 30b of the insulating film 30 is preferably 10% or less, more preferably 5% or less of the thickness T of the insulating film 30. When considering the unevenness of the main surface 30b, a length from the reference surface K to a top of the highest projection of the main surface 30b may be the thickness T of the insulating film 30.

Further, in the embodiment, the plurality of types of bottom surfaces R are 5 types or less. When the number of types of bottom surface R with different depth positions are excessive, it is difficult to maintain the flatness for the bottom surface R. The flatness for the bottom surface R can be maintained by setting the number of the plurality of types of bottom surface R to 5 or less.

Figure 8:
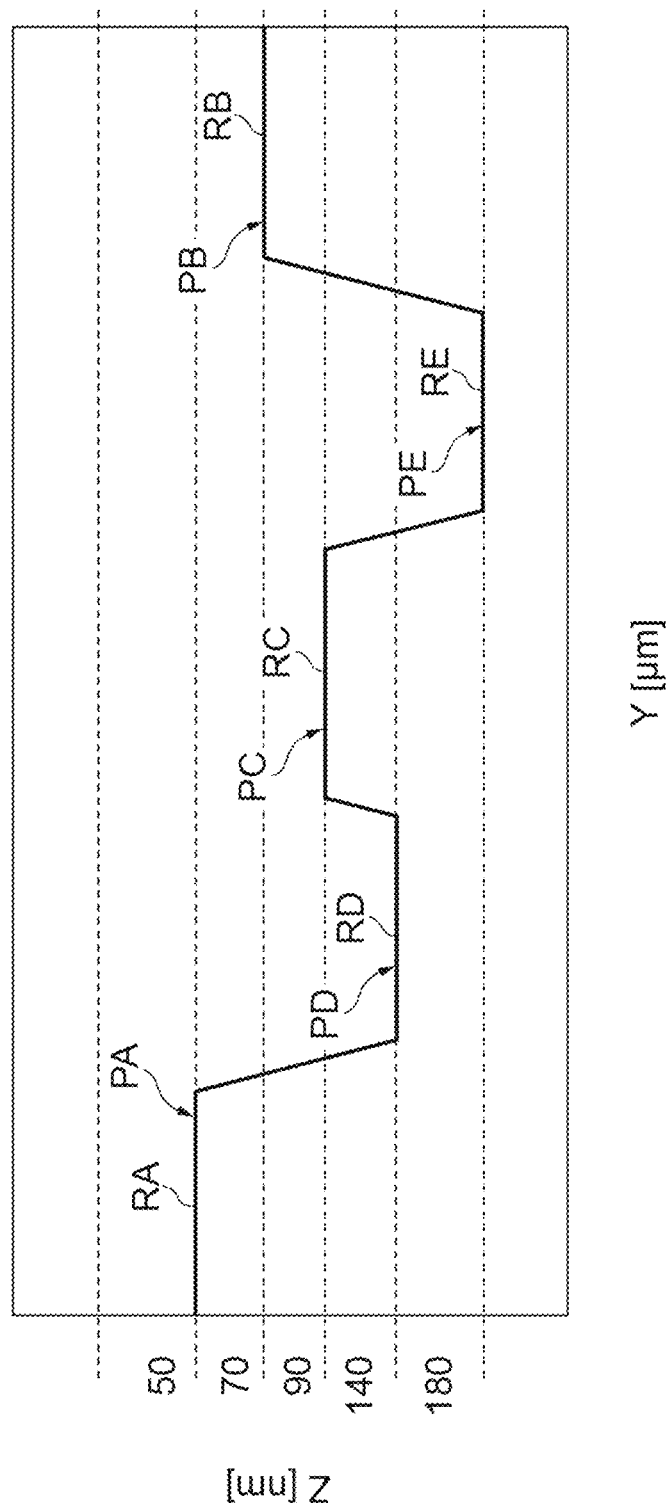
FIG. 8 is an enlarged cross-sectional view of a main part showing a part of a photosensitive region of a solid-state imaging device according to a modified example of the first embodiment.

FIG. 8 is an enlarged cross-sectional view of a main part showing a part of a photosensitive region of a solid-state imaging device according to a modified example of the first embodiment. FIG. 8 shows a cross-sectional view of a portion corresponding to the cross-sectional view taken along line Y-Y in FIG. 3. This modified example is different from the above-described embodiment in that five types of bottom surfaces RA to RE having different depths are defined by five types of recesses PA to PE. A depth ZA of the bottom surface RA is 50 nm, a depth ZB of the bottom surface RB is 70 nm, a depth ZC of the bottom surface RC is 90 nm, a depth ZD of the bottom surface RD is 140 nm, and a depth ZD of the bottom surface RE is 180 nm. Further, one arrangement pattern is formed in the order of a recess PA, a recess PD, a recess PC, a recess PE, and a recess PB in the first direction, and the arrangement pattern is repeatedly arranged in the first direction. In this form, the cancelling-out of the period of variation in the spectral sensitivity with respect to the wavelength of the incident light can occur more effectively. Therefore, the variation in sensitivity in a wide wavelength region from the ultraviolet region to the near infrared region can be further sufficiently reduced.

Figure 9:
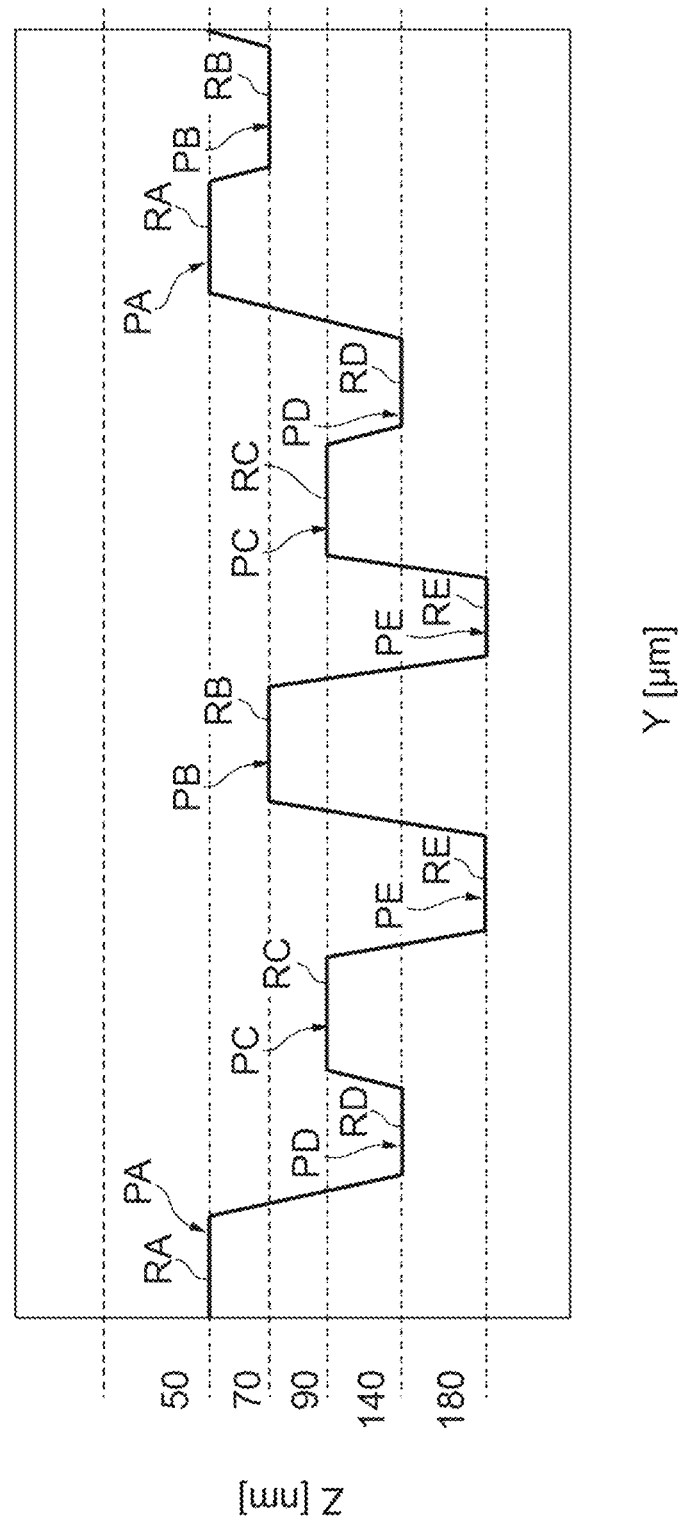
FIG. 9 is an enlarged cross-sectional view of a main part showing a part of a photosensitive region of a solid-state imaging device according to another modified example of the first embodiment.

FIG. 9 is an enlarged cross-sectional view of a main part showing a part of a photosensitive region of a solid-state imaging device according to another modified example of the first embodiment. As shown in the drawing, in this modified example, lengths of five types of recesses PA to PE in the first direction are half of the form shown in FIG. 8. In this form, one arrangement pattern is formed in the order of a recess PA, a recess PD, a recess PC, a recess PE, a recess PB, a recess PE, a recess PC, a recess PD, a recess PA, and a recess PB in the first direction, and the arrangement pattern is repeatedly arranged in the first direction. In this form, the mountain valley shape formed between the adjacent bottom surfaces R on the main surface 20*a* becomes denser, and the flatness for the main surface 30*b* of the insulating film 30 can be improved.

Second Embodiment

Figure 10:
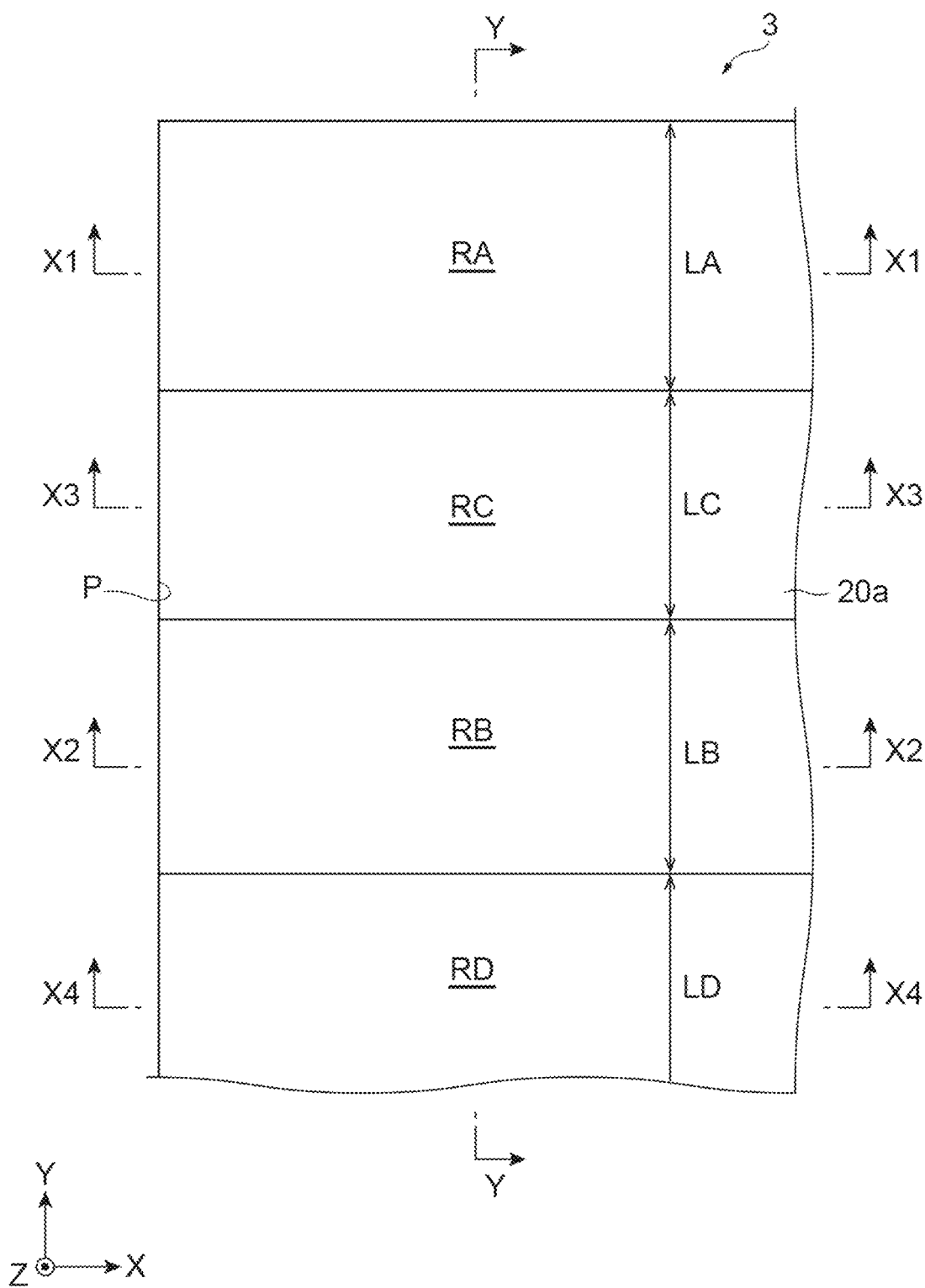
FIG. 10 is an enlarged plan view of a main part showing a part of a photosensitive region of the solid-state imaging device according to the second embodiment.
Figure 11:
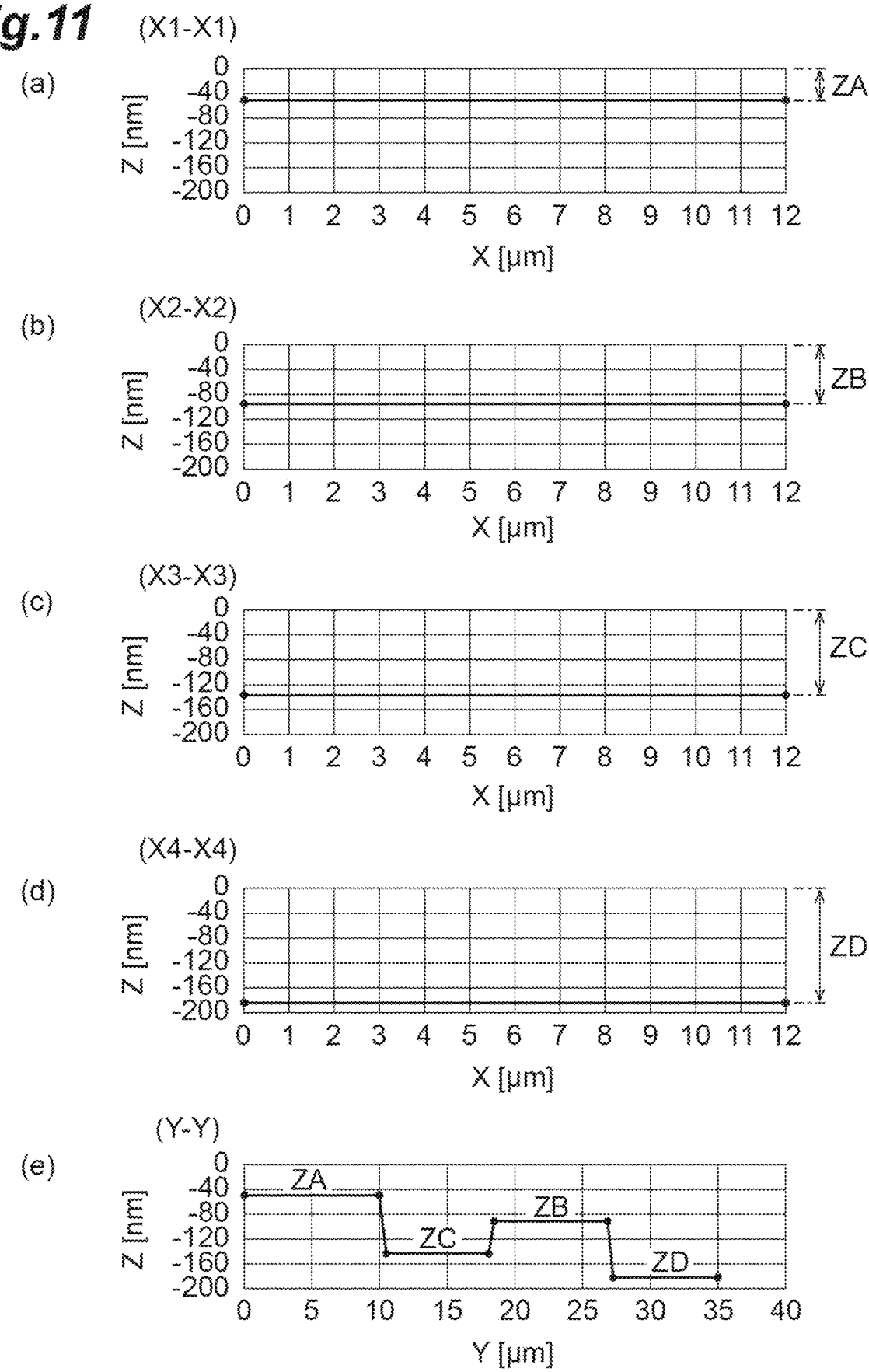
FIG. 11 is a cross-sectional view at a predetermined position in FIG. 10.

FIG. 10 is an enlarged plan view of a main part showing a part of a photosensitive region of a solid-state imaging device according to a second embodiment. Further, FIG. 11 is a cross-sectional view taken at a predetermined position in FIG. 10. As shown in FIGS. 10 and 11, in the second embodiment, each of the plurality of types of bottom surfaces RA to RD is defined by a single recess P. That is, in this form, the recesses P are not separated from each other, and one recess P includes the bottom surfaces R having a plurality of depths. Further, in the plan view of the main surface 20*a*, the bottom surfaces R having different depths are continuous in the first direction, and the bottom surfaces R having the same depth are continuous in the second direction.

More specifically, in this form, one arrangement pattern is formed in the order of a bottom surface RA, a bottom surface RC, a bottom surface RB, and a bottom surface RD in the first direction, and the arrangement pattern is repeatedly arranged in the first direction. A depth of each of the bottom surfaces R is the same as that of the first embodiment. That is, a depth ZA of the bottom surface RA is 50 nm, a depth ZB of the bottom surface RB is 90 nm, a depth ZC of the bottom surface RC is 140 nm, and a depth ZD of the bottom surface RD is 180 nm. An opening width (here, a width in the first direction) L of each of the bottom surfaces RA to RD is sufficiently larger than the thickness T, regardless of the thickness T of the insulating film 30. Here, a width LA of the bottom surface RA is 10.5 μm, a width LB of the bottom surface RB is 8.3 μm, a width LC of the bottom surface RC is 8.0 μm, and a width LD of the bottom surface RB is 7.8 μm.

In the embodiment, the bottom surfaces RA to RD constituting the single recess P are formed in a sufficient area. Therefore, when the recess P is seen as a whole, since the bottom surfaces RA to RD have constant flatness, it is possible to reduce the conformability of the shape of the insulating film 30 when the insulating film 30 is formed on the main surface 20*a* of the semiconductor substrate 20. Therefore, the flatness for the main surface 30*b* of the insulating film 30 can be sufficiently improved.

Third Embodiment

Figure 12:
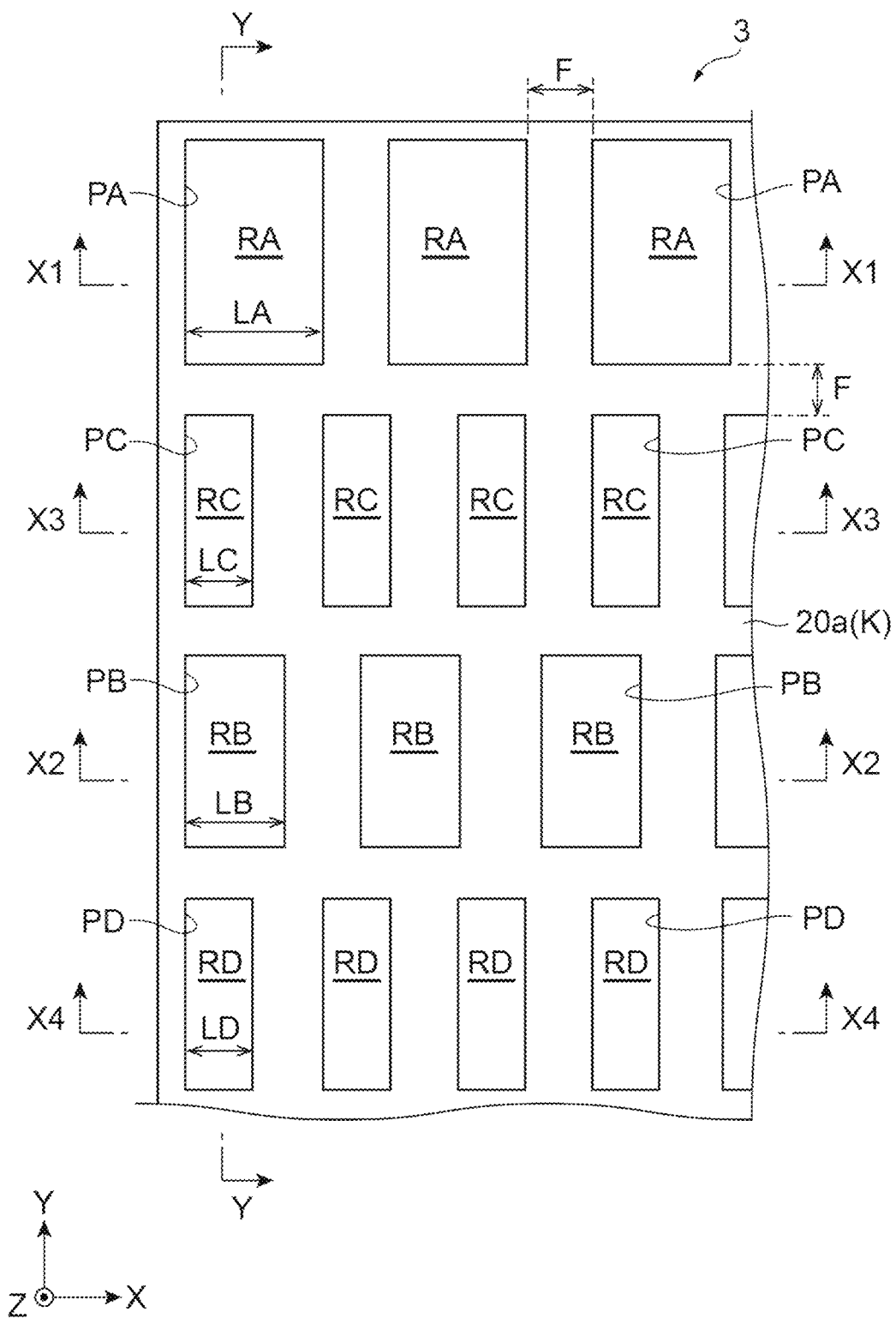
FIG. 12 is an enlarged plan view of a main part showing a part of a photosensitive region of the solid-state imaging device according to a third embodiment.

FIG. 12 is an enlarged plan view of a main part showing a part of a photosensitive region of a solid-state imaging device according to a third embodiment. Further, FIG. 13 is a cross-sectional view taken at a predetermined position in FIG. 12. As shown in FIGS. 12 and 13, in the third embodiment, as in the first embodiment, a plurality of types of bottom surfaces RA to RD are respectively defined by a plurality of types of recesses PA to PD. Further, in the plan view of the main surface 20*a*, the recesses P having different depths are arranged to be spaced apart from each other in the first direction, and the recesses P having the same depth are arranged to be spaced apart from each other in the second direction.

The arrangement pattern of the recesses PA to PD in the first direction, the depths ZA to ZD of the bottom surfaces RA to RD, and the opening widths LA to LD of the recesses PA to PD are all the same as those in the first embodiment. Further, in each of the recess PA to the recess PD, a spacing width F in the first direction and the second direction is 1.0 μm. Therefore, in the embodiment, the reference surface K is interposed with a width of 1.0 μm to surround the recesses PA to PD (refer to FIGS. 13(*a*) to 13(*e*)).

In the embodiment, since the reference surface K is located around the recesses PA to PD, the flatness for the main surface 30*b* of the insulating film 30 is sufficiently ensured. Further, one of interferences having different optical path lengths may occur between the reference surface K located around the recesses PA to PD and the main surface 30*b* of the insulating film 30. This also contributes to canceling out the period of variation in the spectral sensitivity with respect to the wavelength of incident light and acts to enhance the effect in which the variation in sensitivity in a wide wavelength region from the ultraviolet region to the near infrared region is reduced.

Fourth Embodiment

Figure 14:
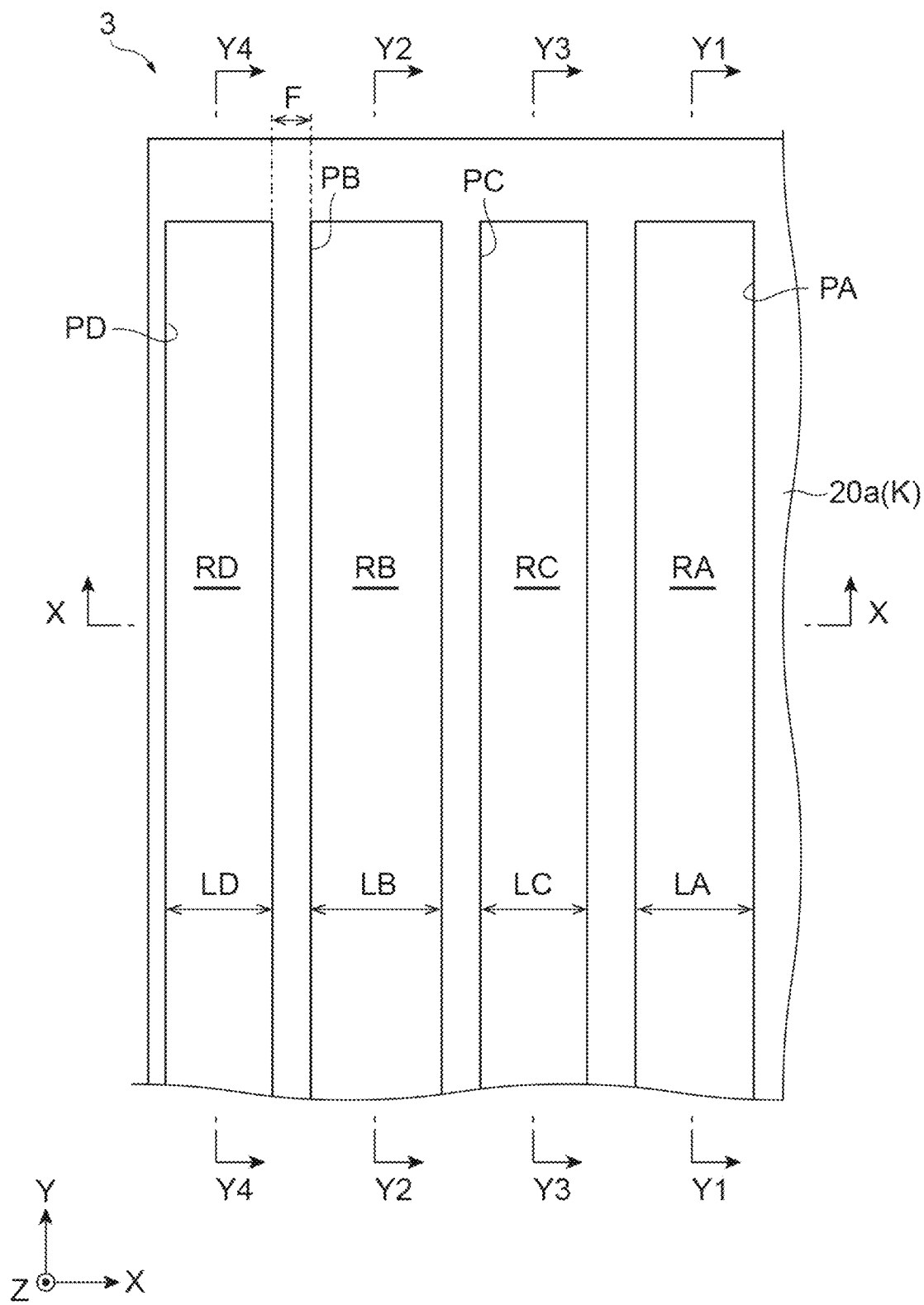
FIG. 14 is an enlarged plan view of a main part showing a part of a photosensitive region of the solid-state imaging device according to a fourth embodiment.
Figure 15:
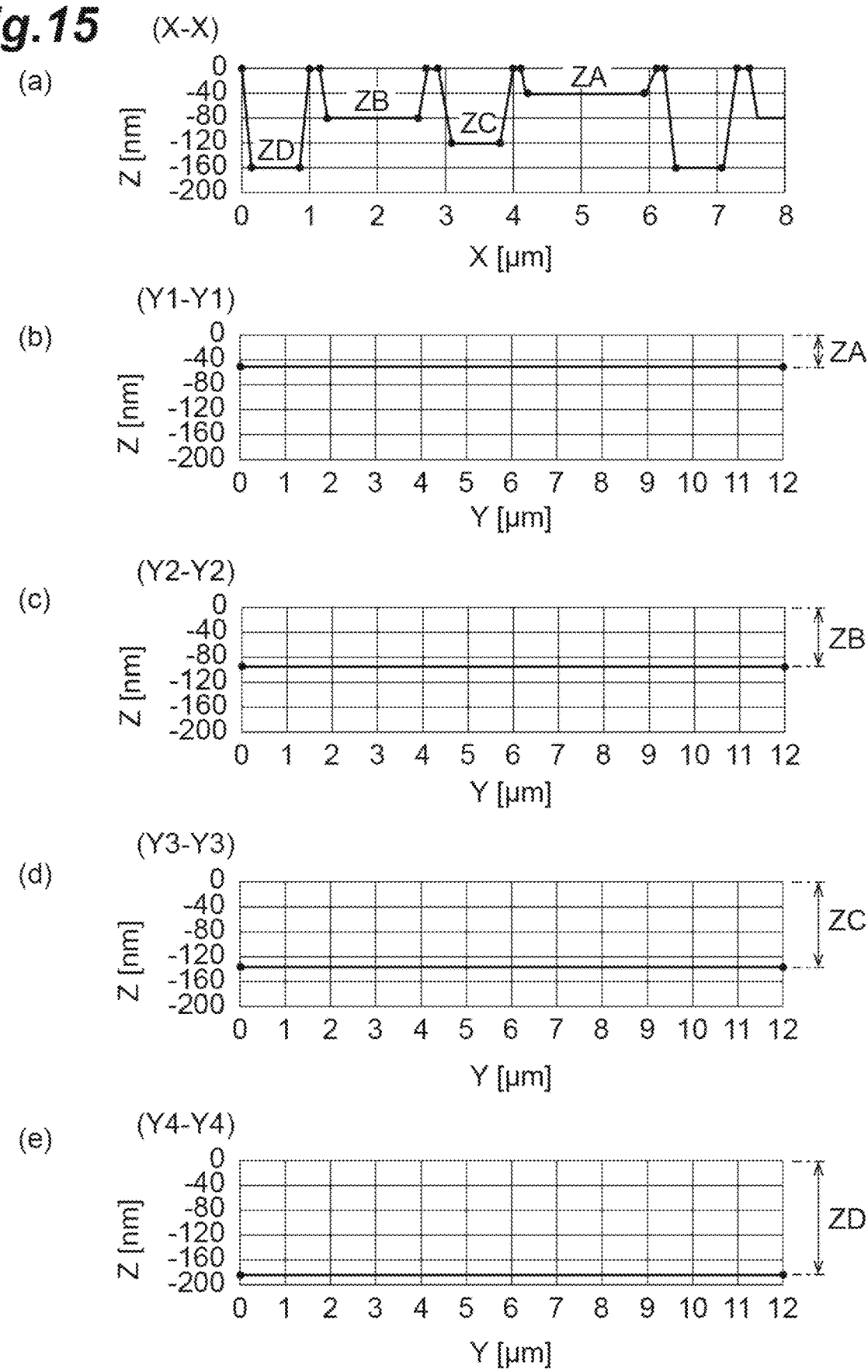
FIG. 15 is a cross-sectional view at a predetermined position in FIG. 14.

FIG. 14 is an enlarged plan view of a main part showing a part of a photosensitive region of a solid-state imaging device according to a fourth embodiment. Further, FIG. 15 is a cross-sectional view taken at a predetermined position in FIG. 14. As shown in FIGS. 14 and 15, in the fourth embodiment, as in the first embodiment, the plurality of types of bottom surfaces RA to RD are respectively defined by the plurality of types of recesses PA to PD. Further, in the plan view of the main surface 20*a*, the recesses PA to PD extend in the first direction, and the recesses PA to PD having different depths are arranged to be spaced apart from each other in the second direction.

In the embodiment, one arrangement pattern is formed in the order of the recess PD, the recess PB, the recess PC, and the recess PA in the second direction, and the arrangement pattern is repeatedly arranged in the second direction. The depths ZA to ZD of the bottom surfaces RA to RD and the opening widths LA to LD of the recesses PA to PD (here, the widths in the second direction) are all the same as those of the first embodiment. In each of the recesses PA to PD, the spacing width F in the second direction is 0.2 μm.

Also in the embodiment, the periods of variation in the spectral sensitivity with respect to the wavelength of the incident light cancel each other out, and the variation in sensitivity in a wide wavelength region from the ultraviolet region to the near infrared region can be sufficiently reduced. Further, in the embodiment, since each of the recesses PA to PD is provided in a band shape in the first direction, the shapes of the recesses PA to PD can be simplified.

Figure 16:
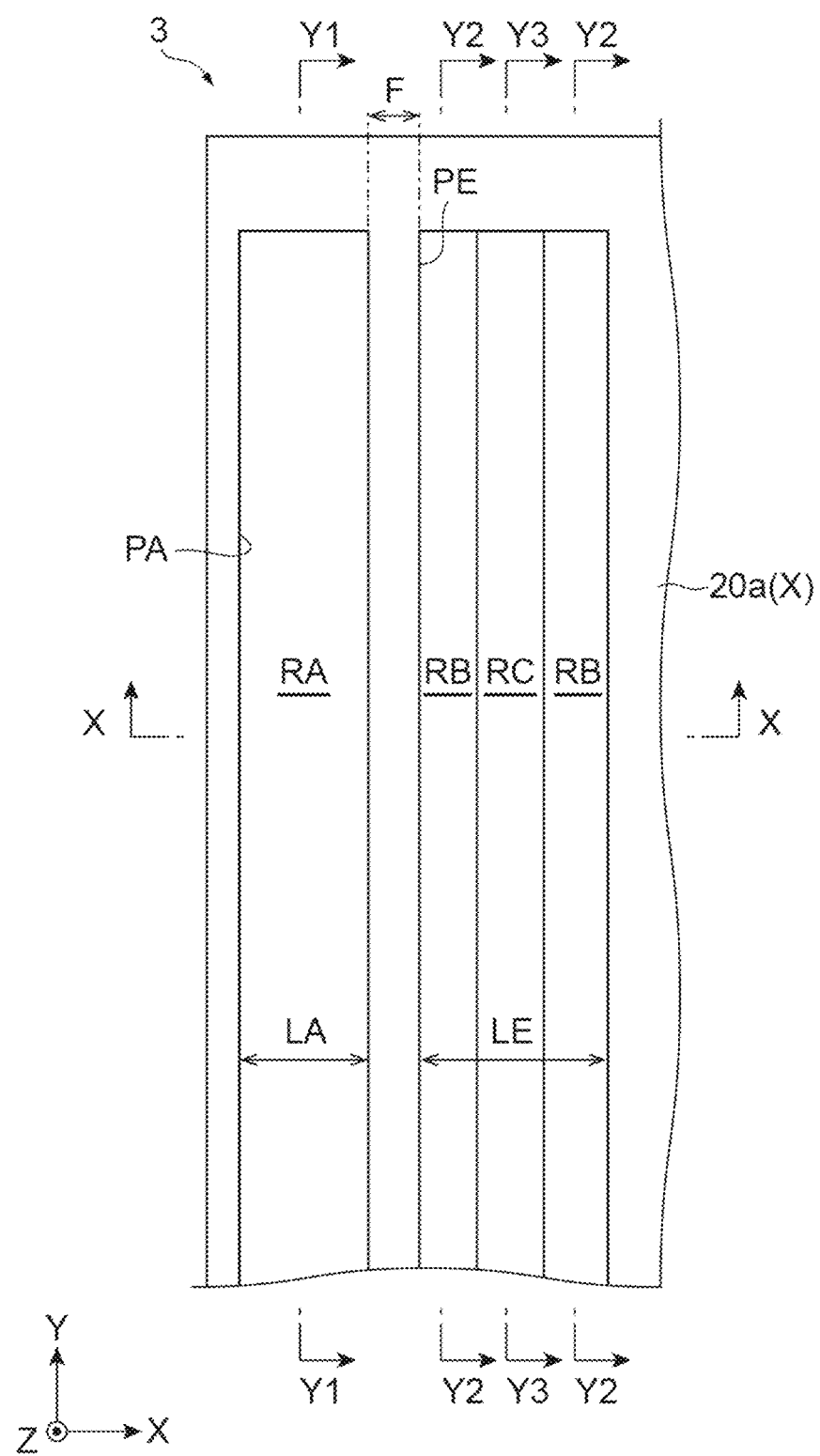
FIG. 16 is an enlarged plan view of a main part showing a part of a photosensitive region of the solid-state imaging device according to a modified example of the fourth embodiment.
Figure 17:
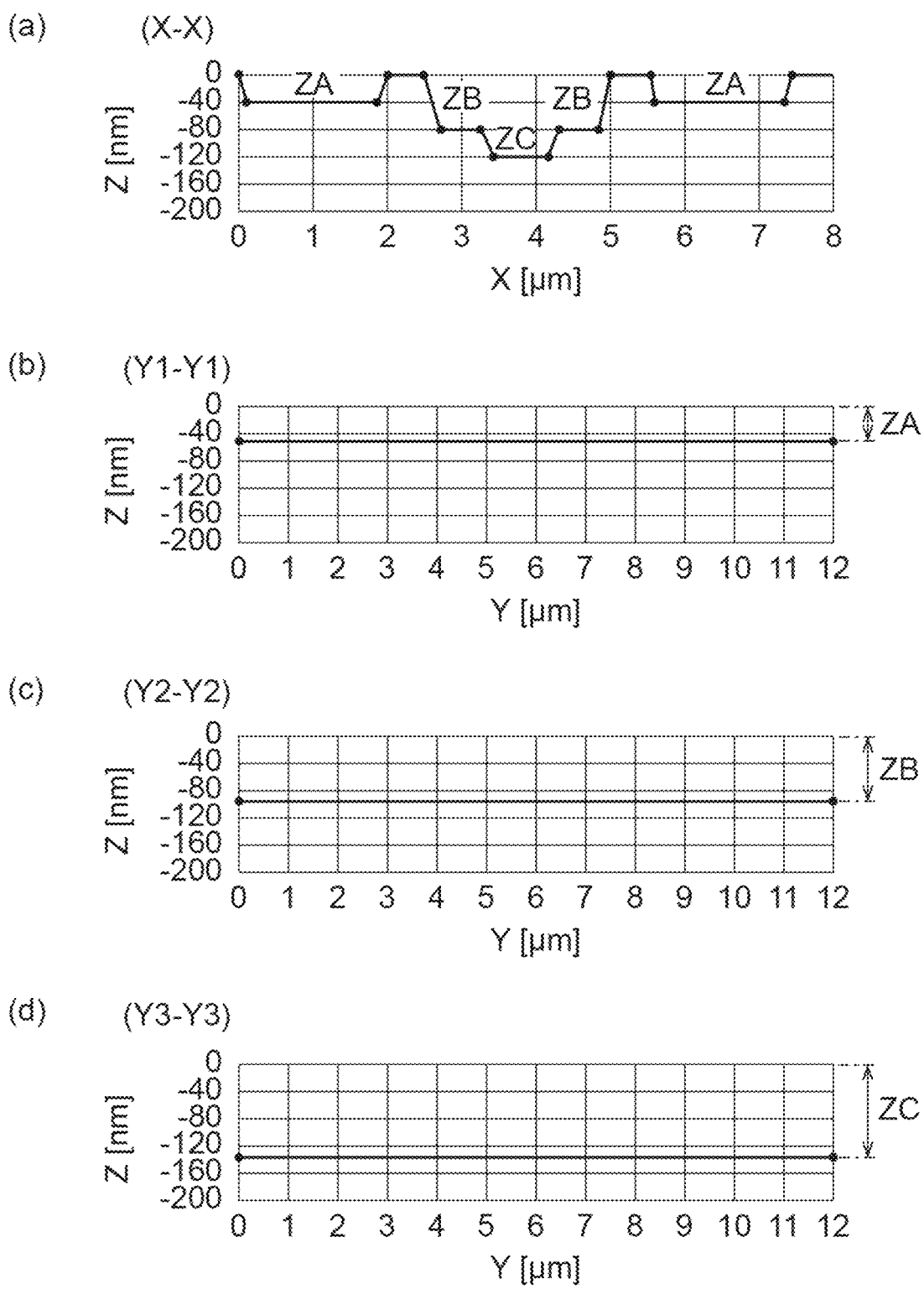
FIG. 17 is a cross-sectional view at a predetermined position in FIG. 16.

FIG. 16 is an enlarged plan view of a main part showing a part of a photosensitive region of a solid-state imaging device according to the modified example of the fourth embodiment. Further, FIG. 17 is a cross-sectional view taken at a predetermined position in FIG. 16. This modified example is different from the fourth embodiment in that at least one of the recesses P has a single recess P which defines two or more types of bottom surfaces R.

In this form, three types of bottom surfaces RA to RC are defined by two types of recesses PA and PE. The recesses PA and PE extend in the first direction and are arranged to be spaced apart from each other in the second direction, as in the fourth embodiment. In this form, one arrangement pattern is formed in the order of the recess PA and the recess PE in the second direction, and the arrangement pattern is repeatedly arranged in the second direction.

The bottom surface RA is defined by the recess PA, and the bottom surface RB and the bottom surface RC are defined by the recess PE. In the recess PE, the bottom surface RC is defined in the center, and the bottom surfaces RB are defined on both sides of the bottom surface RC. A depth ZA of the bottom surface RA is 50 nm, a depth ZB of the bottom surface RB is 90 nm, and a depth ZC of the bottom surface RC is 140 nm. An opening width (here, a width in the second direction) LA of the recess PA is 2.0 μm, and an opening width LE of the recess PE is 2.5 μm. In the recess PE, the width of the bottom surface RC (the width in the second direction) may be larger than the width of the bottom surface RB. A spacing width F in the second direction between the recess PA and the recess PE is 0.5 μm. Also in such a form, it is possible to more effectively cancel out the period of variation in the spectral sensitivity with respect to the wavelength of the incident light while the shapes of the recesses PA and PE are simplified.

Other Modified Examples

The disclosure is not limited to the above-described embodiments. For example, in each of the above-described embodiments, although the configuration in which the plurality of photosensitive regions 3 are disposed in an array in the one-dimensional direction is exemplified, a configuration in which the plurality of photosensitive regions are disposed in an array in a two-dimensional direction may be adopted. Further, in each of the above-described embodiments, although the rectangular bottom surface R and the recess P are exemplified, the shapes thereof may be other rectangular shapes such as a square shape, or may be a circular shape, an elliptical shape, an oval shape, or the like. The opening width L of the recess P is defined by the width of the short side in the case of a rectangular shape and is defined by a diameter in a short axis direction in the case of an elliptical shape.

Dimensions of the recess P and the bottom surface R can be appropriately changed in design. Although the values exemplified in each of the above-described embodiments are designed from the viewpoint of curbing the variation in the spectral sensitivity especially in the ultraviolet region, for example, the dimensions of the recess P and the bottom surface R may be adjusted for the purpose of curbing the variation in the spectral sensitivity in the visible region or the near infrared region. Further, in each of the above-described forms, although the main surface 30b and the bottom surface R of the insulating film 30 are shown in parallel with each other, the main surface 30b and the bottom surface R of the insulating film 30 may be non-parallel within a range in which the canceling-out effect of the period of variation in the spectral sensitivity is not impaired.

REFERENCE SIGNS LIST

1: solid-state imaging device, 3: photosensitive region, 20: semiconductor substrate, 20a: main surface, 30: insulating film, 30b: main surface, K: reference surface, L (LA to LE): opening width, P (PA to PE): recess, R (RA to RE): bottom surface, T: thickness of insulating film.

The invention claimed is:

1. A solid-state imaging device, comprising:
   a semiconductor substrate configured to have a main surface having a plurality of photosensitive regions; and
   an insulating film configured to be provided on the main surface of the semiconductor substrate,
   wherein a thickness of the insulating film from a reference surface is 0.5 μm or more, when the main surface of the semiconductor substrate is taken as the reference surface,
   a surface of the insulating film on a side opposite to the main surface is a surface having flatness, and
   a plurality of types of bottom surfaces of which depths from the reference surface are different from each other are provided on the main surface of the semiconductor substrate in the photosensitive regions.

2. The solid-state imaging device according to claim 1, wherein a bottom surface having a relatively shallow depth from the reference surface and a bottom surface having a relatively deep depth from the reference surface are alternately adjacent to each other in the plurality of types of bottom surfaces.

3. The solid-state imaging device according to claim 1, wherein:
   a plurality of types of recesses configured to define each of the plurality of types of bottom surfaces are provided, and
   the recesses having different depths are continuous in a first direction, and the recesses having the same depth are arranged to be spaced apart from each other in a second direction orthogonal to the first direction, in a plan view of the main surface.

4. The solid-state imaging device according to claim 1, wherein:
   a single recess configured to define each of the plurality of types of bottom surfaces is provided, and
   the bottom surfaces having different depths are continuous in a first direction, and the bottom surfaces having the same depth are continuous in a second direction orthogonal to the first direction, in a plan view of the main surface.

5. The solid-state imaging device according to claim 1, wherein:
a plurality of types of recesses configured to define each of the plurality of types of bottom surfaces are provided, and
in a plan view of the main surface, the recesses having different depths are arranged to be spaced apart from each other in a first direction, and the recesses having the same depth are arranged to be spaced apart from each other in a second direction orthogonal to the first direction.

6. The solid-state imaging device according to claim 1, wherein:
a plurality of types of recesses configured to define each of the plurality of types of bottom surfaces are provided, and
in a plan view of the main surface, each of the recesses extends in a first direction, and the recesses having different depths are arranged to be spaced apart from each other in a second direction orthogonal to the first direction.

7. The solid-state imaging device according to claim 6, wherein at least one of the recesses has a single recess configured to define two or more of the plurality of types of bottom surfaces.

8. The solid-state imaging device according to claim 3, wherein an opening width of the recess is twice or less the thickness of the insulating film.

9. The solid-state imaging device according to claim 3, wherein an opening width of at least one of the recesses is equal to or less than the thickness of the insulating film.

10. The solid-state imaging device according to claim 1, wherein the plurality of types of the bottom surfaces are 5 types or less.

11. The solid-state imaging device according to claim 1, wherein a height of unevenness of a surface of the insulating film on the side opposite to the main surface is smaller than a maximum depth of the plurality of types of bottom surfaces.

12. The solid-state imaging device according to claim 4, wherein an opening width of the recess is twice or less the thickness of the insulating film.

13. The solid-state imaging device according to claim 5, wherein an opening width of the recess is twice or less the thickness of the insulating film.

14. The solid-state imaging device according to claim 6, wherein an opening width of the recess is twice or less the thickness of the insulating film.

15. The solid-state imaging device according to claim 4, wherein an opening width of at least one of the recesses is equal to or less than the thickness of the insulating film.

16. The solid-state imaging device according to claim 5, wherein an opening width of at least one of the recesses is equal to or less than the thickness of the insulating film.

17. The solid-state imaging device according to claim 6, wherein an opening width of at least one of the recesses is equal to or less than the thickness of the insulating film.

* * * * *